United States Patent [19]

Angst

[11] 4,224,604
[45] Sep. 23, 1980

[54] DIGITAL OPTICAL DISPLAY WITH MAGNETIC CODE PLATE INDEXING

[75] Inventor: Walter Angst, Zumikon, Switzerland

[73] Assignee: Ackeret Design + Engineering, Ebmatingen, Switzerland

[21] Appl. No.: 877,355

[22] Filed: Feb. 13, 1978

[30] Foreign Application Priority Data

Feb. 18, 1977 [DE] Fed. Rep. of Germany ....... 2707082

[51] Int. Cl.² .......................... G08C 9/06; H03K 13/00
[52] U.S. Cl. .......................... 340/347 P; 177/DIG. 5; 177/DIG. 6; 250/231 SE; 340/347 M
[58] Field of Search .................. 177/DIG. 3, DIG. 5, 177/DIG. 6, 210 R, 174, 256–258; 250/231 SE; 340/347 M, 347 P

[56] References Cited

U.S. PATENT DOCUMENTS

| 2,627,069 | 12/1971 | Ray et al. | 250/231 R X |
| 3,666,031 | 5/1972 | Provi et al. | 177/256 X |
| 3,853,191 | 12/1974 | Yamagiwa | 177/210 R |

FOREIGN PATENT DOCUMENTS 2363601 7/1974 Fed. Rep. of Germany .... 177/DIG. 3

Primary Examiner—Thomas J. Sloyan
Attorney, Agent, or Firm—H. Dale Palmatier

[57] ABSTRACT

A digital optical display device incorporated in a scale including a movable measuring member, a code plate with opaque and transparent areas, a stationary light source irradiating the code plate, a seven-segment display adjacent the code plate and having light guide inlets receiving the coded light transmitted through the code pattern on the code plate, a magnetic indexing system associated with the code plate and defining a multiplicity of magnetic indexing locking positions arranged in step by step relation to each other to retain the code plate in any of the multiplicity of discrete positions; a spring coupling between the measuring member and the code plate and yieldable within one magnetic index position of the location at which the measuring member has stopped to locate the code plate at the position of a discrete code pattern.

28 Claims, 35 Drawing Figures

DIGITAL OPTICAL DISPLAY WITH MAGNETIC CODE PLATE INDEXING

The invention relates to a digital optical display device having the features recited in the preamble of patent claim 1.

BACKGROUND OF INVENTION

The principle of a digital optical display comprising a seven-segment display for ciphers may be derived from FIGS. 13 and 14 of publication DT-AS No. 19 19 798 with the respective portions of its specification. A light source is mounted on one side of a code plate moved by a watch movement in angular increments. At each angular step a certain code pattern defined by holes in the plate is passed between the light source and the light inlets of fibre optical light guides, the other ends of said light guides being deformed to define the bars of the seven-segment display and being spacedly arranged in a corresponding fashion.

The input signal to be displayed basically is the angular position of the movement spring housing representative of the time period expired since the rewinding of the watch movement. This input signal is already digital due to the watch escapement system.

If it is desired to optically display analog input signals, too, and make use of such a digital display additional problems will occur since the stroke or the angle through which the measuring member has moved and which is representative of the analog value to be displayed must be definitely allocated to a certain number of stroke or angle increments of the code plate. It is evident that suitably the light inlets of the light guides must be aligned with that code of the code plate whose digital value is most approximate to the analog value to be displayed. This involves that somewhere in the system the analog value must be digitalized so that the interpolation makes sense.

A solution for this problem is described and illustrated in DT-OS No. 23 49 764. Therein the analog measured value, viz. the load of a scale is transduced into a proportional rotation of the code plate whose angular position, thus, is still an analog value. The code plate further is provided with a uniform optical index corresponding to the digial increments and optically scanned. By means of a servo loop the light inlets are moved relative to the code plate, the servo signal being derived from said optical index.

Although the last-metioned system is operational it has the drawbacks of being extremely complex and cumbersome. Even if instead of a proportional automatic control a two point control is provided which necessitates less effort, the code on the other hand must be made one and a half times larger than the light inlets so that as a result, the space necessary for the system is still increased. Finally, a source for auxiliary energy for the servo mechanism is indispensable.

It has been tried already to provide the code plate with a preferably magnetic indexing system as described and illustrated for example in DT-OS No. 23 33 195. In the latter publication, however, there is not an optical code plate but one having conductive and non-conductive, respectively, area, this code plate being electrically scanned and serving likewise the digital display of weights. Although there are provisions made to eliminate the reaction due to the friction of the scanning electrodes there is nevertheless no operative display reliable within the entire range of the measurements. The reason is that the indexing system necessarily acts for each increment with substantially the same moving force upon the code plate, said force reacting upon the measuring system and disbalancing the position thereof. If the balanced position as in a scale is defined by balance between the weight load and a removing deflection proportional spring bias, the new balance position will result just in a more or less approximated alignment of code and scanning elements depending upon the beginning or the end of an increment. In result one would have to use larger code area than normally necessary for the digitalizing.

SUMMARY OF INVENTION

It is the object of the invention to provide a digital optical display device producing, with a minimum of effort and simultaneously with a minimum of space required correct digitalizing of analog measuring values.

Accordingly the code plate is provided with an indexing system and a magnetic indexing system is chosen since the forces thereof are independent of friction and, thus, substantially constant even for long-term operation. However, the code plate is not rigidly coupled to the measuring member as in the known devices but loosely so that the reaction forces cannot affect the balance condition of the position finally achieved during the measurement. The resiliency of the coupling is dimensioned such that in the range between two increments it is "softer" than the magnetic indexing forces, but "stronger" within the range between three increments. In this manner the code area need be just little larger than the light inlets under the provision that between the code pattern on the one hand and the magnetic indexing system on the other hand an alignment is achieved which is correspondingly accurate. Means provided for this purpose in connection with the invention are particularly inexpensive indexing systems.

BRIEF DESCRIPTION OF DRAWINGS

Embodiments of the subject of the invention will be explained in detail hereunder, reference being made to the attached drawings.

DETAILED SPECIFICATION

Figure 1:
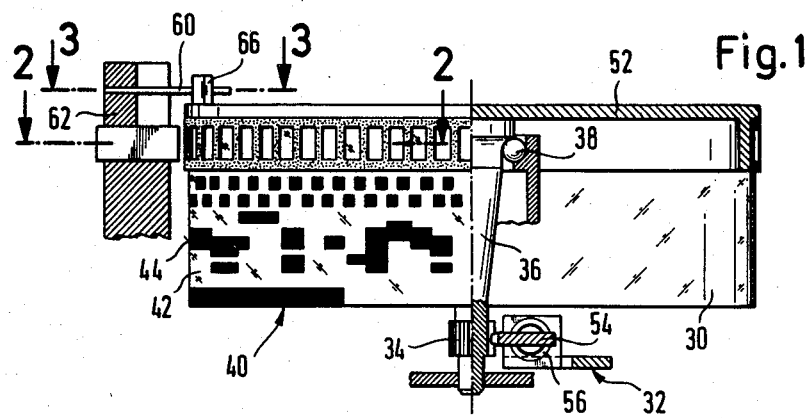
FIG. 1 illustrates schematically and partly in section a side elevation of a device according to the invention wherein only those parts important for the invention have been detailedly shown.
Figure 2:
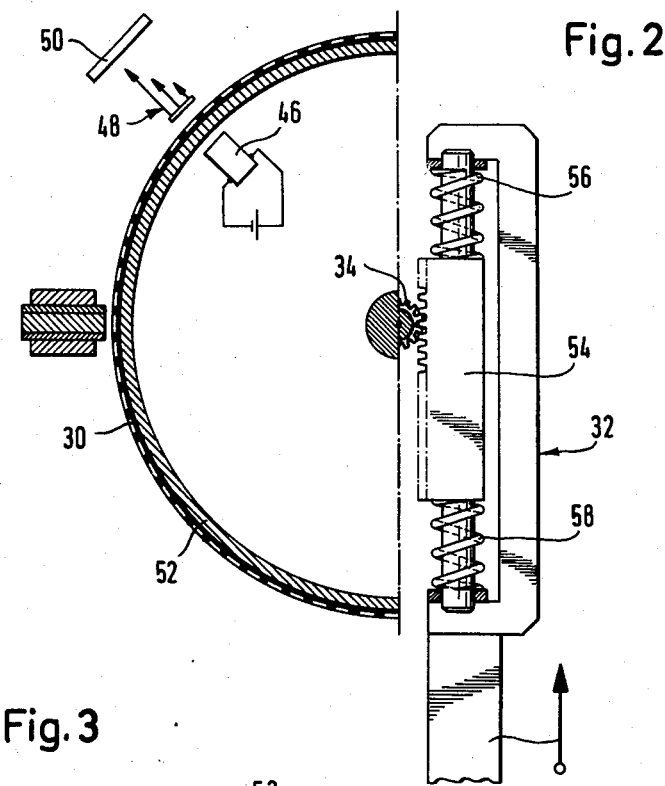
FIG. 2 is a section through the device of FIG. 1 along line 2—2 thereof.
Figure 3:
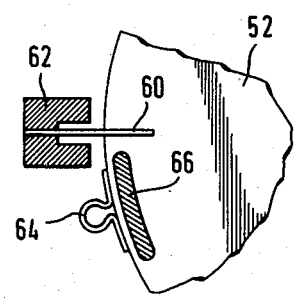
FIG. 3 is a partial section according to line 3—3 of FIG. 1, FIGS. 4–7 show details of the magnetic indexing system with dimensions which are important for the operation.

As an example for the entire device a scale has been chosen in FIGS. 1-3, and it may be assumed a bath scale having a maximum weight of 100 kg. The scale platform (not shown) deflects upon being loaded a linear measuring member 32 against the force of a bias spring (not shown) so that the deflection is proportional to the load. The deflection of the member 32 is transmitted in a manner to be described later to a pinion 34 which is wedged onto the lower end of a shaft 36. Shaft 36 supported by means of ball bearing 38 carries the code plate 30 which is designed as a cylindrical skirt. The code pattern 40 is indicated in FIG. 1, left hand. It consists of transparent area 42 and opaque area 44 which in accordance with the position of the plate block the light from a light source 46 and permit its passage, respectively, whereafter it is decoded by means of a light guide device 48 and illuminates on a seven-segment display 50 one or several ciphers in accordance with the code. The light source 46, the light guides 48, and the display 50 may be designed in accordance with the DT-AS No. 19 19 798, mentioned above, and, thus, need not be described in detail.

The code plate 30 in this embodiment is a plastic film clamped onto a carrier 52. It is assumed that the pinion 34 will make a complete revolution of 360° upon full load and that the display interpolation is to be made between weights which differ from eachother by 0.5 kg which means that the display error is 250 p maximum.

The code plate accordingly must be able to assume 100:0.5 discrete positions so that the indexing step of the system is 1.8°. Because of this small angle the indexing system will be disposed at a maximum diameter, for example at 15 cm diameter. In this case the angle corresponds to an arcuate measure of about 2.5 mm. Before the possible designs of the indexing system will be discussed at first the transmission of the movement of member 32 to pinion 34 is to be explained.

The member 32 carries slidably thereupon a portion of a toothed rack 54, the teeth thereof engaging pinion 34 substantially free of backlash. The neutral position of the rack 54 is determined by two pressure springs 56, 58 abutting on the hand member 32, on the other hand rack 54; eventually one spring would be sufficient fastened at both said members. The bias of the springs 56, 58 is extremely small.

If the scale is suddenly subjected to a load due to the elasticity of the biasing spring (not shown) of the weighing system an oscillatable attenuated system is excited resulting in an oscillation of the member 32 about its final position, this oscillation being transmitted to the rack 54, delayed by springs 56, 58. The magnetic indexing system acts now in a manner to be described later upon the pinion 34, tending to stop this in indexing positions; the indexing positions correspond, of course, to those relative positions of code plate 30 and light guides 48 that the latter are facing unambiguously either to an opaque or a transparent area of the code plate, but never to a boarder line therebetween.

The springs 56, 58 or an equivalent resilient system are dimensioned with respect to their force-characteristic in such a manner that they will yield just within one increment to be interpolated so that the pinion will lock itself onto an index position, however, will prevent the locking at any indexing position therebefore or thereafter. Within the adjustment incrementions could also provide a dead-way between the rack 54 and the member 32, limited by stops. However, in such a case the displayed result would be determined from the side from which the code plate would finally come to a standstill at the end of the oscillations so that the average error would be greater, which is to be eliminated.

FIG. 3 shows that the transitions during the oscillations suitably are stopped elastically if the carrier 52 tends to rotate more than 360°. Leaf spring 60 serving as the stop is stationarily mounted in a support 62 above the carrier 52 and cooperates with a projection 66.

Neglecting the influence of this additional destortion there are still two coupled oscillatable systems: The weighing mechanism with the bias spring as its elasticity, and substantially the person to be weighed as the mass, and second the display system comprising springs 56, 58 and carrier 52 with members 30, 36, 34, and 54 mounted thereupon as a pivotable pendulum. It is important to have the additional inertia introduced by the indexing system as small as possible so that the display system will come to a standstill within about the same time as the weighing system, the latter being considerably attenuated.

In summary the following requirements should be met by the indexing system:

It should comprise a minimum of moving masses, its locking force should be adjustable within certain tolerances, its dimensions should be small, it must be aligned with the code within small tolerances, and finally, the expenses for manufacture must be extremely little. Embodiments designed under consideration of such requirements will be explained in detail hereunder.

FIGS. 4–7 show the embodiment used in the scale of FIGS. 1–4. A locking permanent magnet circuit (designated hereafter as "lock") cooperates with a soft iron annulus having the shape of a ladder, designated hereinafter as "latch". The latch annulus is clamped upon carrier 52 by means of mounting means 64 and simultaneously clamps the code plate 30. The alignment may be provided during assembly by means of optical devices.

The lock comprises a permanent magnet 70 in block shape polarized in direction of its thickness d. Two pole pieces 72 of soft iron serve the concentration of the magnetic flux onto air gap a existing between the latch 76 and the adjacent edges of the pole pieces 72, which must be present so that the code plate may rotate unimpededly. Each pole piece 72 is a sheet material having a thickness of s so that the distance p between the centers of the two pole pieces is d+s.

Figure 4:
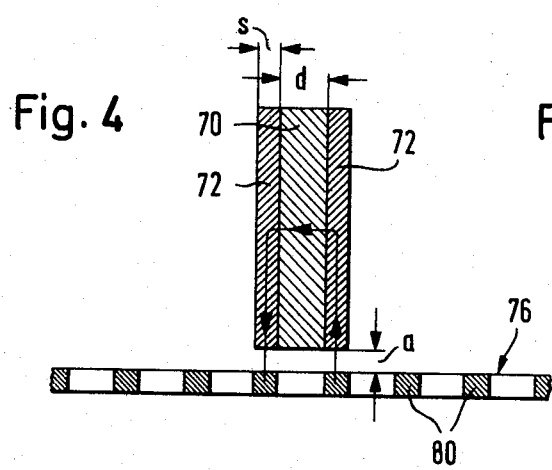
Figure 5:
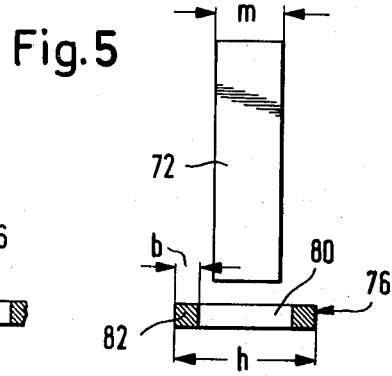
Figure 6:
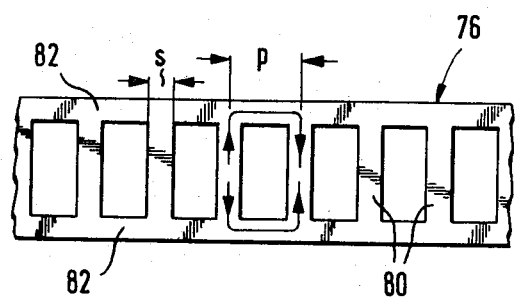

The latch shown in FIG. 6 in side elevation, in FIG. 4 in horizontal section, and in FIG. 5 in vertical section has a ladder configuration comprising rungs 80 having a width s and a center spacing p and stringers 82 having a width b equal at least to s/2. The hole width h of the "ladder" suitably exceeds the dimension m of the pole pieces in the area of the inner gap a so that the magnetic circuit from the edges of the pole pieces 72 will be closed primarily via the rungs 80 and only thereafter via the stringers 82.

Figure 7:
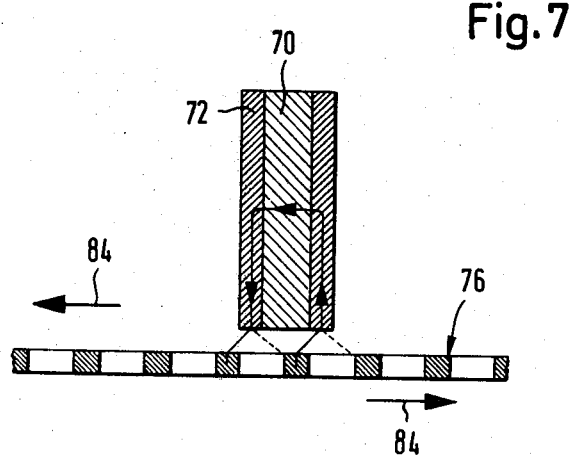

FIG. 4 shows a locking position with minimum total air gap of 2a while FIG. 7 shows a disbalance condition wherein the size of the effective air gap is indicated with full lines and broken lines, respectively. The shorter the air gap, the greater the attractive force: Accordingly, a relative movement in direction of arrows 84 will occur. The probability that the code plate and the latch, respectively, will come to a standstill exactly "on center" in a position of instable balance is very small since with the minimum friction of the display system already a very small shock will suffice to destroy the instable balance and will make it switch into a stable one.

Figure 8:
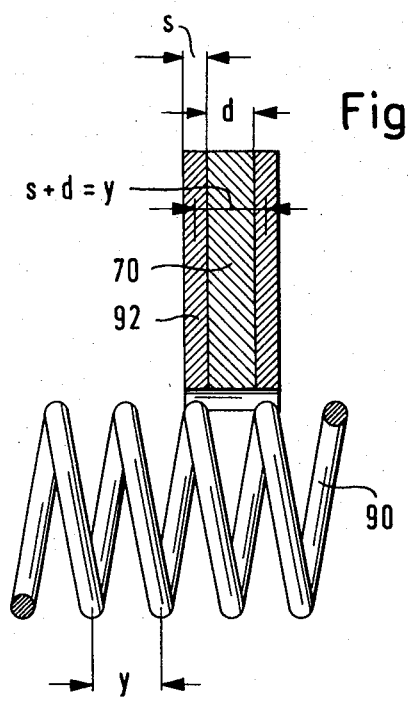
FIGS. 8 and 9 show in plan view and in radial section, respectively, a second embodiment of the indexing system.
Figure 9:
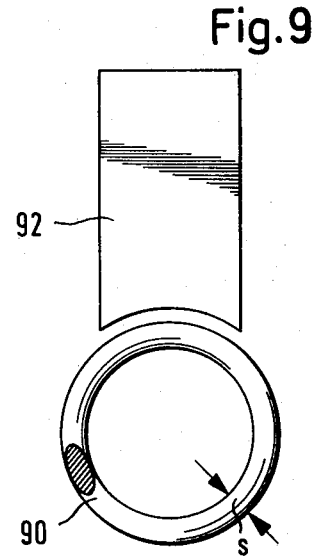

According to FIGS. 8 and 9 the latch is a helical spring 90 closed in itself and having a circular or (not shown) rectangular section shape, wound with a pitch y=s+d of a wire having a thickness s. With a circular section the pole pieces 92 have circular cut-out flux emitting edges.

Figure 10:
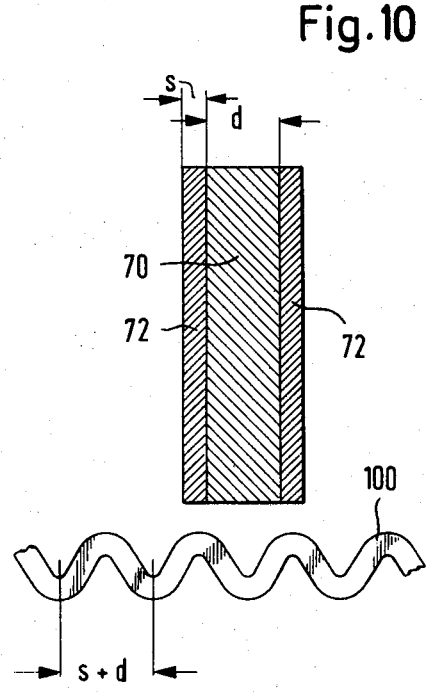
FIGS. 10 and 11 show analog to FIGS. 8 and 9, respectively, a third indexing system.
Figure 11:
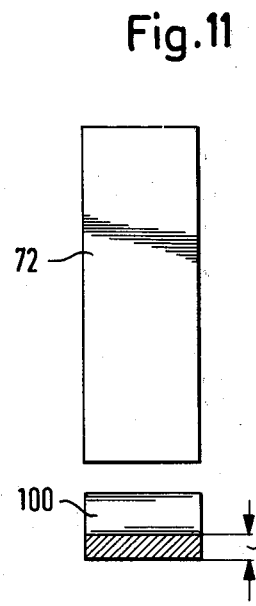

In the embodiment of FIGS. 10 and 11 the lock is designed as in the first embodiment. The latch in this case is a corrugated zigzag corrugated sheet strip 100, the drawings being provided with the corresponding dimensions. Such a strip may be manufactured continuously in a cold pressing process.

Figures 12, 13:
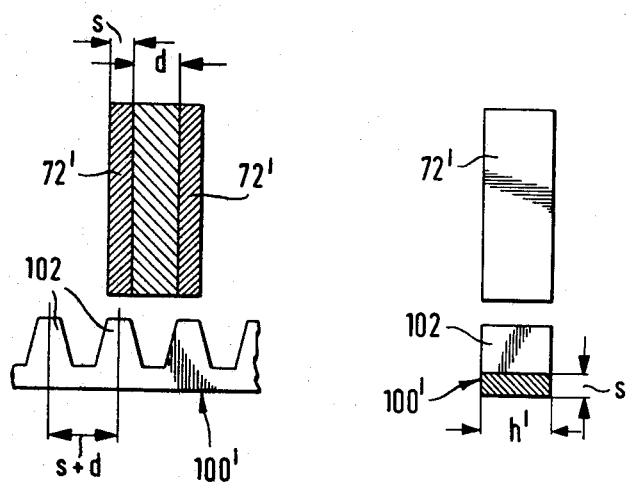
FIGS. 12 and 13 show analog to FIGS. 8 and 9, respectively, a fourth embodiment of an indexing system.

The embodiment of FIGS. 12 and 13 comprises a stamped soft iron strip 100 having protuberances 102 facing the pole pieces. The width h' need be just as large as that of the pole pieces 72'. The other relevant dimensions are indicated in the figures.

Figure 14:
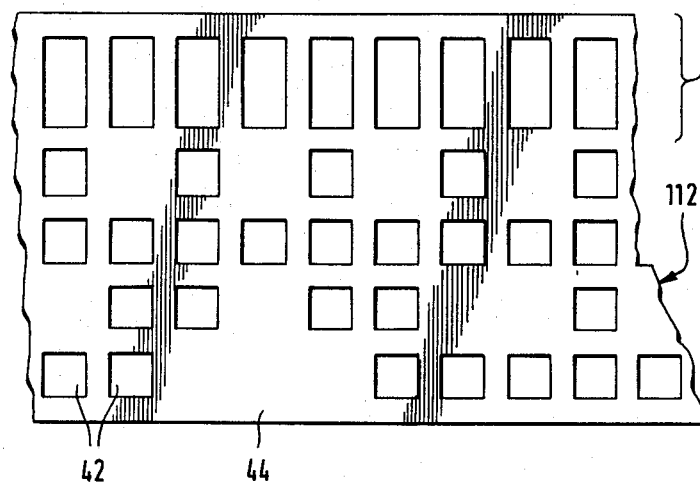
FIGS. 14 and 15 show analog to FIGS. 8 and 9, respectively, a fifth embodiment of a magnetic indexing system.
Figure 15:
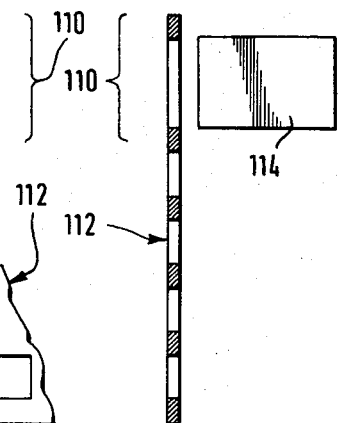

If a code is used wherein between all transparent areas 42, opaque areas 44 will remain the code plate may be cut together with the latch integrally of a soft iron sheet 112. This embodiment is illustrated in FIGS. 14 and 15, the sheet portion 110 forming the latch being designed according to FIGS. 4–7. FIG. 15 illustrates the disposition of the lock 114. If the cutting process is insufficiently accurate one can use an etching process as well.

Figure 16:
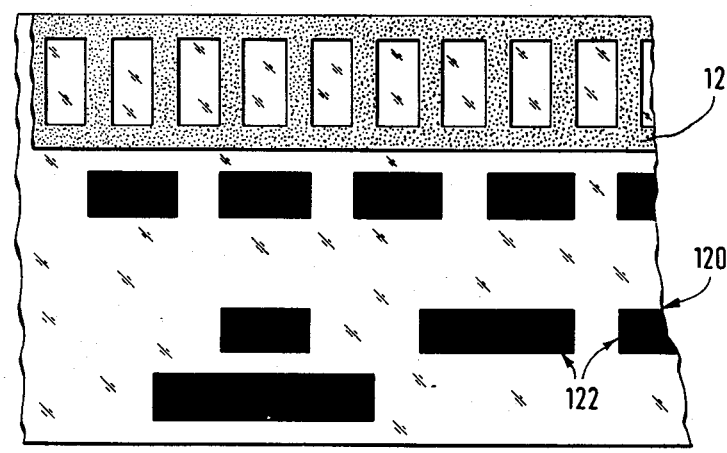
FIGS. 16 and 17 show analog to FIGS. 8 and 9, respectively, a sixth embodiment of a magnetic indexing system.
Figure 17:
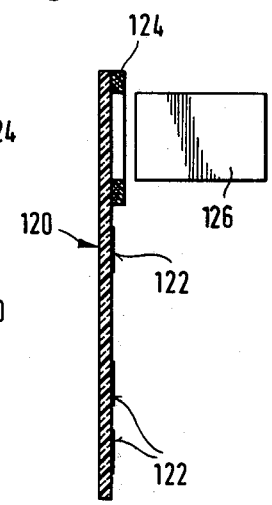

Basically similar is the embodiment of FIGS. 16 and 17. The code plate 120 consists of a transparent plastic carrier with a code 122 printed thereon and the latch 124, too, is printed thereupon and consists of a magnetizable pigment coating. The printing is suitabley made from a polyester carrier under the influence of heat, code 122 and latch 124 being simultaneously transferred. The position of the lock 126 is indicated in FIG. 17.

In all the embodiments it is of importance that the permanent magnet cannot be demagnetized by ambient fields and for this reason one will use a high coercetive material, for example on the base of barium ferrite. The latch, on the contrary must damagnetize itself immediately as soon as it is moved away from the operational field of the lock; this may be obtained by corresponding selection of the material (low coercetive force) and of the length section ratio.

In the embodiments of FIGS. 4–13 the latch was manufactured as a separate member which, however, could easily be aligned with the code. It is an advantage of these designs that the latch may be cheaply manufactured in a continuous non-machining process.

The manufacture of the embodiments of FIGS. 14–17 on the contrary is discontinuous. However, there is no necessity for the extra alignment because this is predetermined by the printing block.

Figure 18:
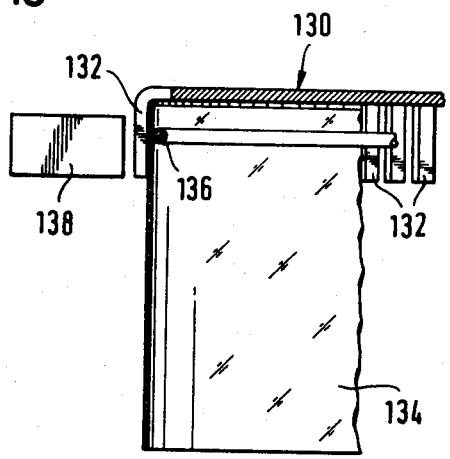
FIGS. 18 and 19 show in sections and in plan view, respectively, a seventh embodiment of the indexing system.
Figure 19:
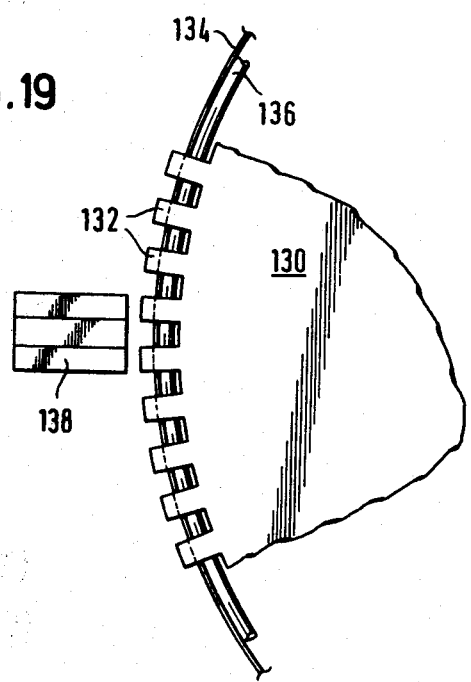

Finally, it is also possible to make the latch integral with carrier 52. Examples are shown in FIGS. 18 and 19 where at the circumference of the carrier 130 the latch is cut and has the shape of teeth 132; teeth 132 may for example be orthogonally bent and form the support for code plate 134, which from the inside is pressed thereupon by means of a spring annulus 136, for example. The relative dimensions of the latch teeth 132 and of the lock 138 correspond to those of the preceding examples. Alternatively, carrier, latch and code plate all together may be made integrally of soft magnetic sheet metal whereafter the code openings are cut or edged from the circumference.

It will be appreciated that in cinematic inversion the latch may be stationary while the lock is moveable with the code plate, the latter in turn not necessarily following a revolving movement but may be moved in other application cases as well translatory. Further, the spacing of the pole pieces may be an integer multiple of the latch pitch.

Figure 20:
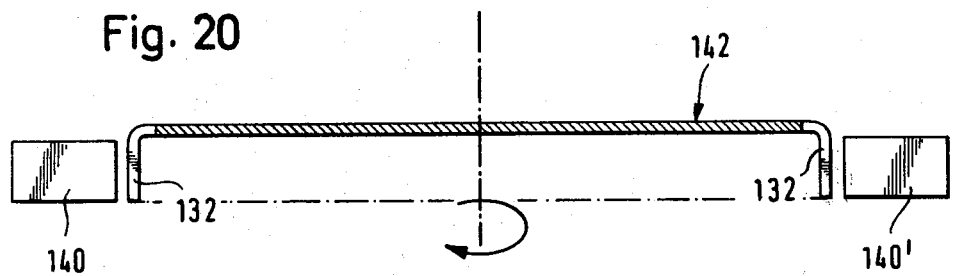

In some cases it will be advantageous or even necessary to remove from the bearings of the member which carries the latch any loads due to magnetic forces or to eliminate deformation of the latch due to magnetic forces. FIG. 20 shows schematically a device comprising two diametrically opposite locks 140, 140' symetrically acting upon a latch 142 so that the bearing thereof (not shown) is not subjected anymore to unilateral forces.

Figure 21:
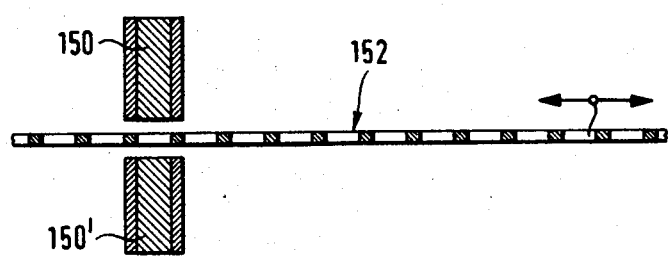
FIGS. 20 and 21 show other embodiments of the indexing system.

FIG. 21 illustrates a device comprising two locks 150, 150' bilaterally disposed of the latch 152 with the same spacing therefrom. It will be understood that in such a design eventually one single permanent magnet will be sufficient, the pole pieces thereof engaging over the latch from both sides thereof.

Further embodiments will be just briefly mentioned. One may provide two locks offset to each other by half a latch pitch so that the number of index positions or increments is doubled because the locks will be effective alternatingly. Further, for example, from a certain measure value the number of rungs may be reduced to one half and the spacing of the pole pieces may be chosen equal to twice the pitch; within this measuring range only double increments will be displayed.

Subject of the invention may be used whereever with simple means an analog value may be represented by a stroke or an angle and is to be displayed in digital fashion.

It will be understood that the basic principle of the invention may be used in designs, too, where the code is scanned electro-optically (light source+photo resistor, photo transistor . . . ) and the result is to be transmitted and displayed electronically.

Figure 22:
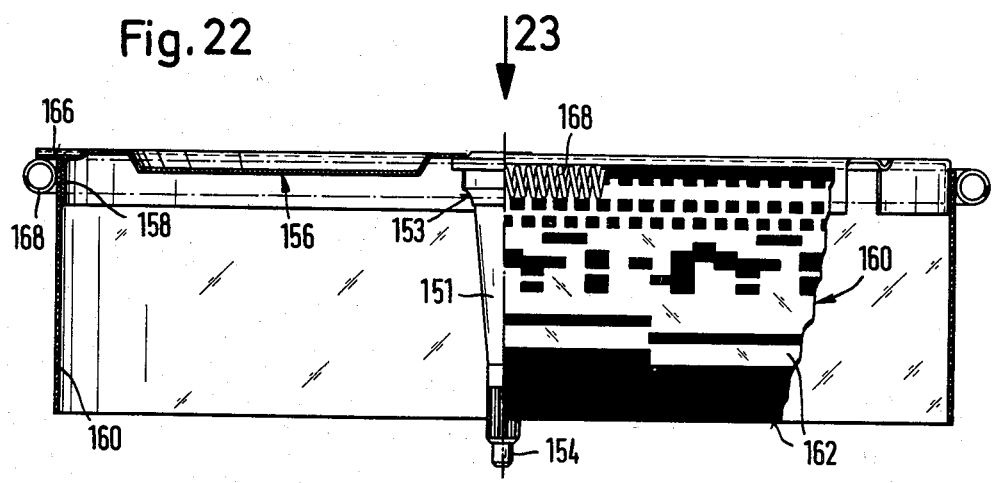
FIG. 22 is a side elevation, partly in section, of the rotatable member of a display system according to the invention.

FIG. 22 shows partly in section a side elevation of a rotatable member comprising a shaft 150 supported in ball bearing 152 and by means of a radial bearing 154. On a metal disk 156 for example made of aluminum having at it circumference a rim 158, a code tape 160 is mounted, the code tape consisting of a transparent film printed or coated with a code 162. The code tape is in abutting relation with five fingers 164 which are not bent from the plane of the disk and are stiffened by means of grooves 166. Thus, the tape is axially positioned. The code tape is radially clamped by means of a latch 166 as shown in FIGS. 8 and 9, the wire ends simply being hooked within each other.

Figure 23:
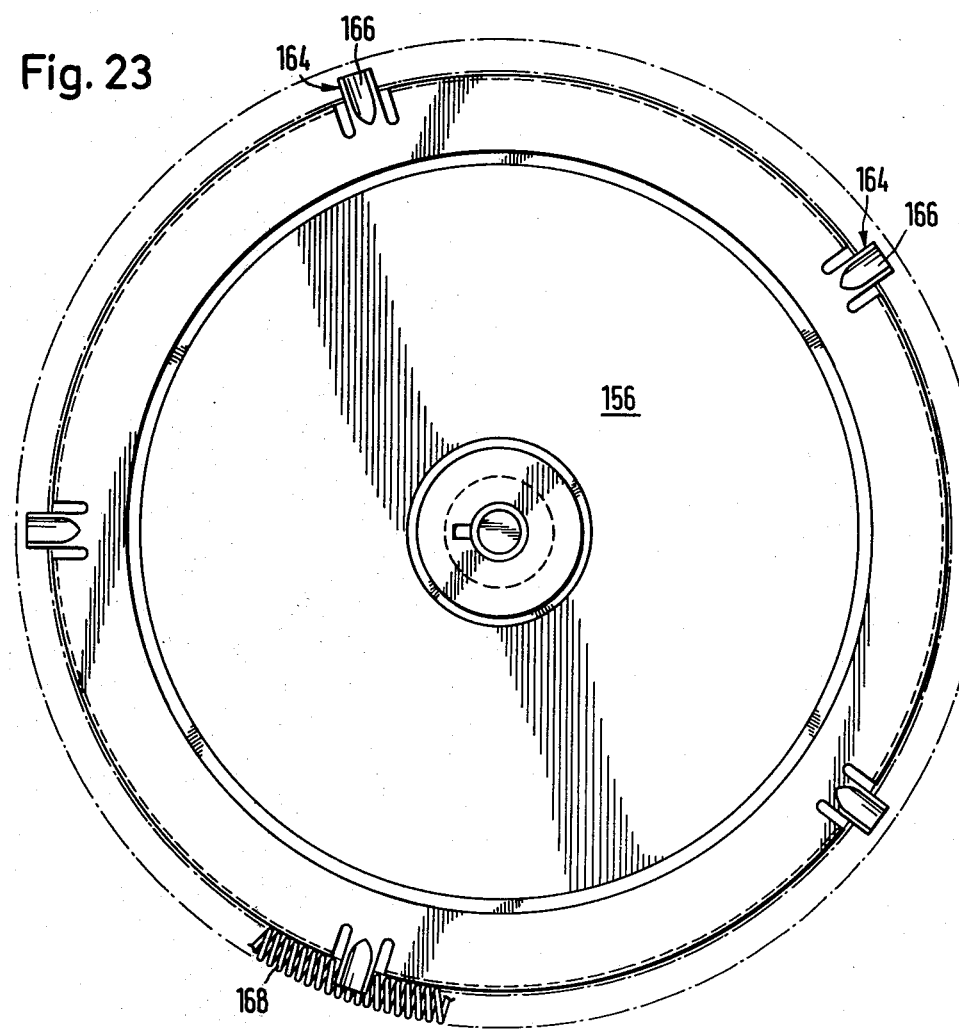
FIG. 23 is a plan view of the member shown in FIG. 22.
Figure 24:
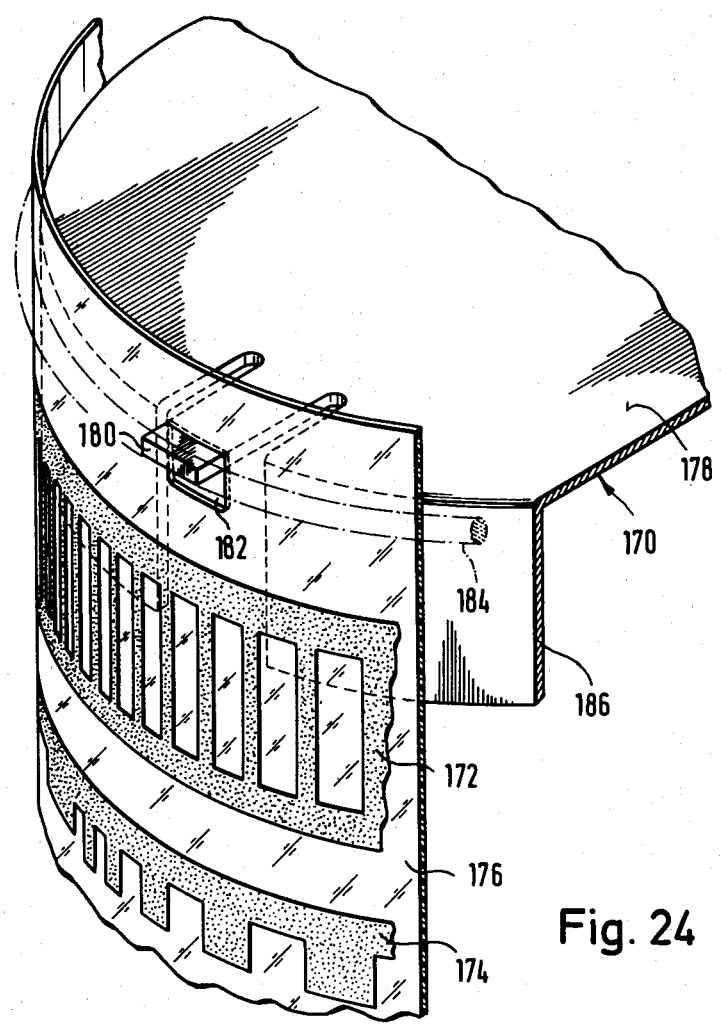
FIG. 24 shows isometrically, partly in section and partly broken away, a rotatable member in another embodiment.

FIG. 23 shows a plan view of this design. In the embodiment of FIG. 24 a similar disk 170 is used. In this case the latch 172 is printed together with code 174 onto a carrier tape 176. The carrier extends axially beyond the upper face 178 of disk 170 and comprises in alignment with circumferential fingers 180 of the disk positioning apertures 182. The carrier 176 is pressed against the crimped rim 186 of disk 170 by means of an annular spring 184 mounted outsidely. In this case the alignment between code 174 and latch 172 is automatically provided by the printing process when the carrier 176 is manufactured.

Figure 25:
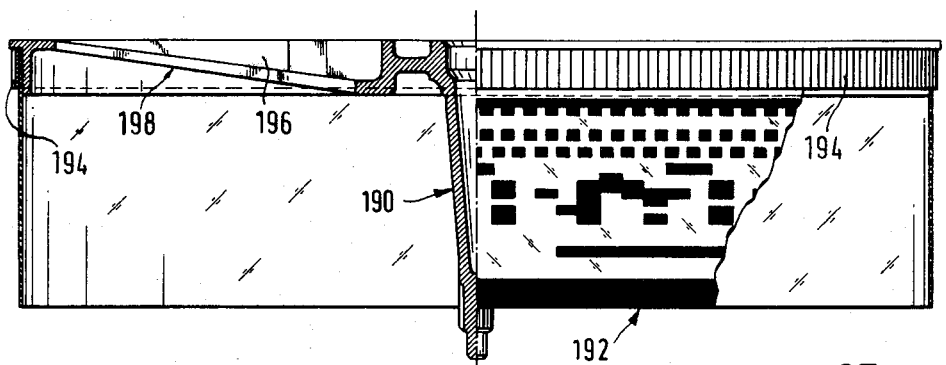
FIG. 25 is a side elevation, partly in section, of a further embodiment of the rotatable member
Figure 26:
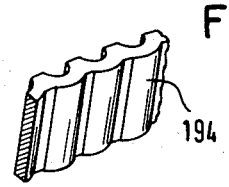
FIG. 26 illustrates isometrically part of a latch of FIG. 25.
Figure 27:
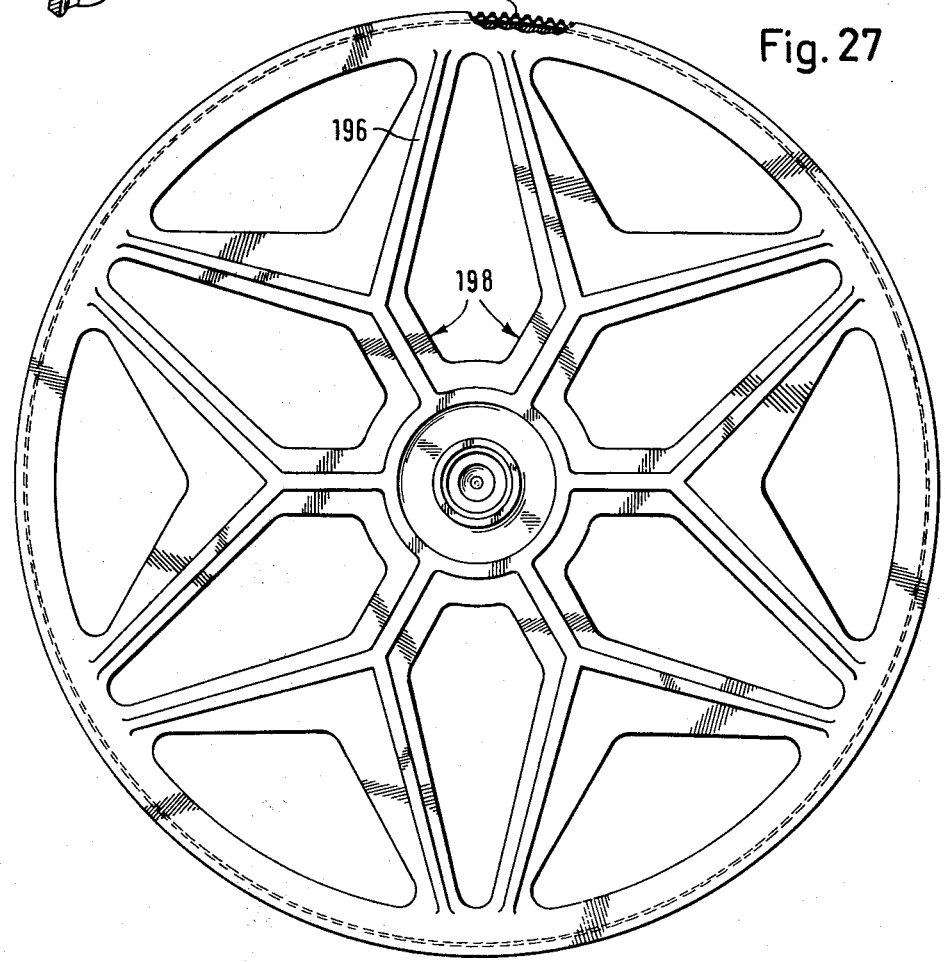
FIG. 27 is a plan view, partly broken away, of the rotatable member shown in FIG. 25.

According to FIGS. 25–27 a rotatable member 190 is provided which may be supported in a similar manner as shown in FIG. 22. A code tape 192 is mounted by means of a clamping latch 194, the latter being similar to the one shown in FIG. 12.

FIG. 26 shows isometrically a portion of the latch. The dimensions are approximately proportionally shown in FIG. 27. The latter drawing also illustrates how the rotatable member 190 may be designed simultaneously light and stable by the provision of rips 196 on spokes 198.

Figure 28:
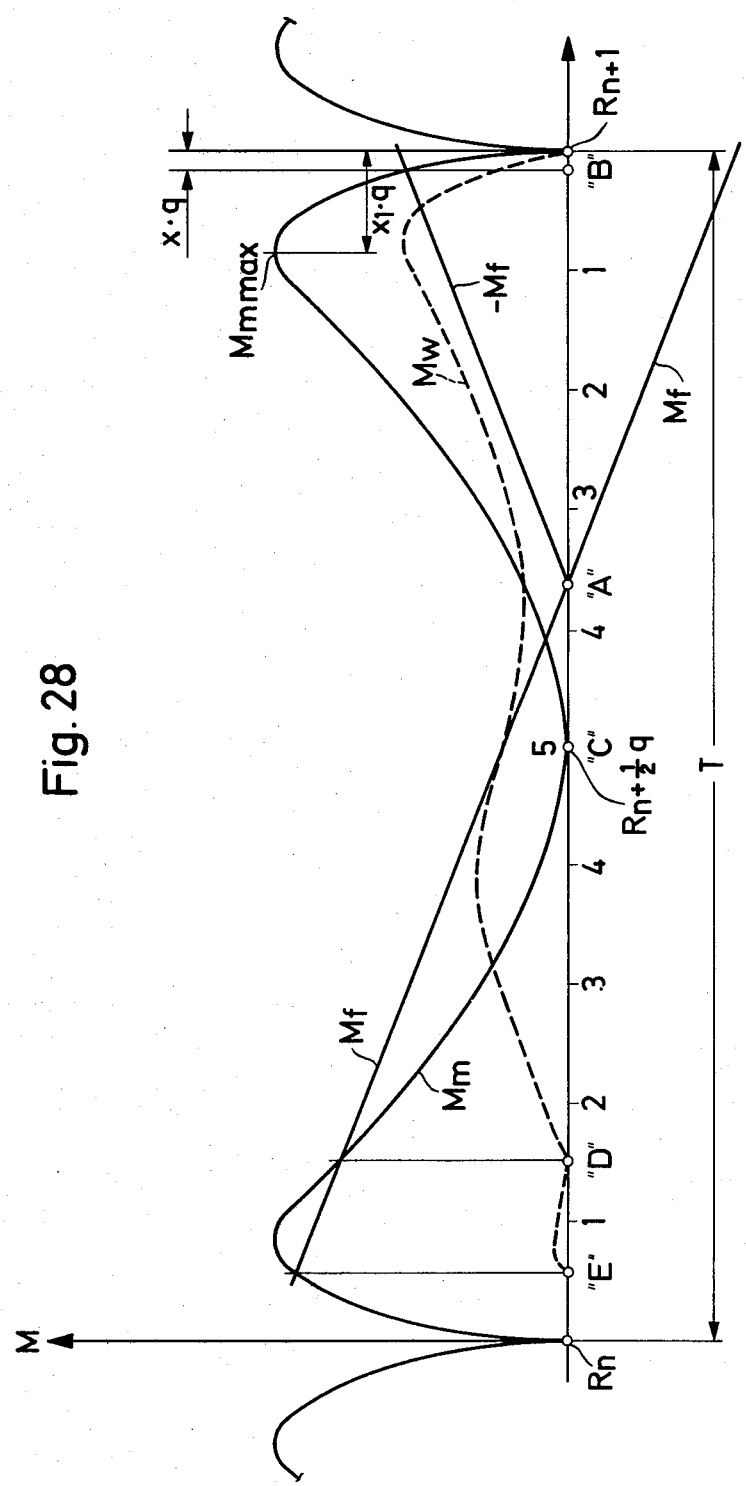
FIG. 28 is a diagram to illustrate the action of the cooperating forces acting upon the rotatable member.
Figure 29:
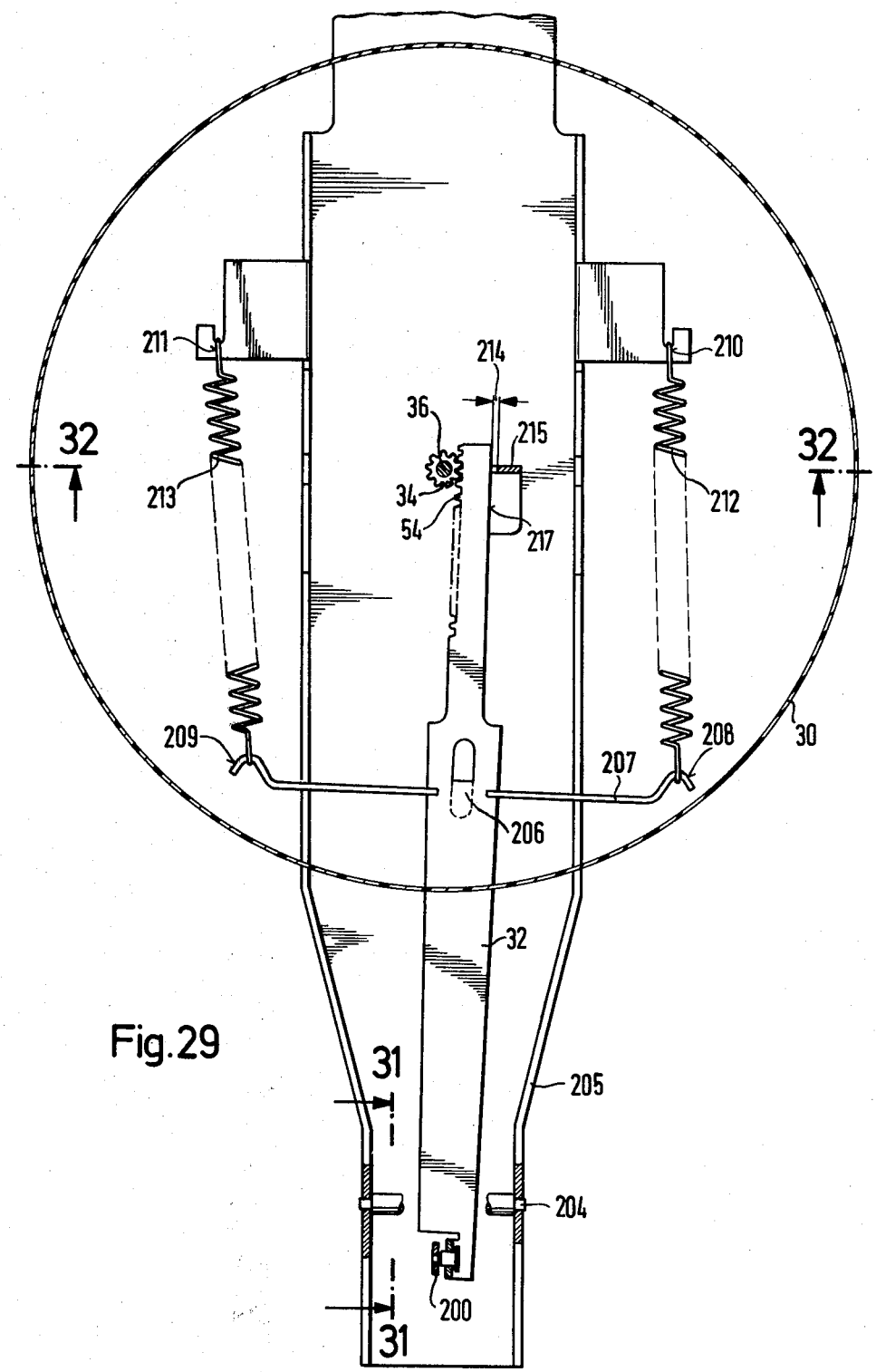
FIG. 29 is a schematic plan view of the moveable parts of a bathroom scale system wherein the elastic coupling is designed in a different manner.

FIG. 28 is a diagram wherein the torque acting upon the code plate or code plate carrier, respectively, is plotted over the deflection of the measuring member, expressed as the arc or angle by which the code plate is rotated.

At first, in circumferential direction a torque acts upon the code plate resulting from the magnetic system. This "magnetic torque" $M_m$ is, of course, zero in the index positions $R_n$, $R_{n+1}$, . . . . It increases from such positions steeply in both lateral direction to a maximum $M_{m\ max}$ and drops, thereybeyond, almost linearly to zero again, since in any position $R_{n+q/2}$ with q=arc travelled by the code plate between two index positions, the magnetic forces of succeeding active latch portions are equal and mutually oppositely directed. The latter position thus is an unstable balance position, because eben an infinite deflection of the code plate in either direction will move it away from this position.

Superposed to the torque $M_m$ is a "spring torque" caused by the force stored in springs 56, 58 unless the initial code plate deflection will be congruent with one of the index positions $R_n$, $R_{n+1}$, . . . .

In FIG. 28 it is assumed that the deflection of the measuring member corresponds to the position "A" between index positions $R_n$ and $R_{n+1}$. Torque $M_m$ will act upon the code plate tending to turn it in direction to index position $R_{n+1}$ thereby compressing, say, spring 56 while simultaneously spring 58 yields; it is assumed that both springs constantly act upon the toothed rack and that no intermediate stop means be provided. In result, straight line $M_f$ represents the countertorque developed by the springs and being proportional to the arc. The intersection of this line with the abscissa (deflection) is, of course, at "A".

Seen form "A" in direction to $R_{n+1}$, torque $M_f$ counteracts $M_m$, and the net or total torque $M_w$ qill result indicated in dashed lines. The code plate will come to a standstill where $M_w=O$. This point is marked "B"; it is offset from $R_{n+1}$ by a distance x·q representing a fraction of a deflection between two adjacent index positions. It is, of course, desired that x·q be small as possible. With spring characteristics relative to the magnetic characteristics, as shown, a differentia arc will result which is smaller than 0.05·q. This has been marked in FIG. 28 in that the spring line $M_f$ has been drawn in a negative sense as $-M_f$ so to clearly indicate its intersection with $M_m$ corresponding to $M_w=O$.

In direction to $R_n$, seen from "A", the torque $M_m$ decreases further while now spring 58 is compressed and spring 56 yields; this event, in fact, will occur for the coupled system are able to oscillate so that the rack will approach its rest position after ascillations about point "A". At first, the torques $M_m$ and $M_f$ are unidirectional and tend to turn the code plate to $R_{n+1}$. Beyond point "C", at $R_{n+q/2}$, torque $M_m$ will now pull in direction while the torque provided by spring 58 still turns in the opposite direction, and its magnitude increases with increasing deflection. Beyond "C" thus the torques must be subtraced from eachother, and it will be seen that at "D" again $M_m = -M_f$. This position, however, is unstable again because with incremental turn in direction $R_n$, $M_m$ will prevail and the code plate will "switch" to "E" adjacent $R_n$. It will also be appreciated that the unstable area between $R_n$ and $R_{n+1}$ has disappeared so that a standstill between index positions is excluded. It will be understood that the foregoing considerations are a mere summary of a detailed calculation wherein friction forces etc. have been considered, but with the diagram in mind an expert sill readily be able to provide additional means to eliminate the remaining uncertainty in the display. Such means may comprise: Steeper spring characteristics with necessarily resulting greater x, stop means to limit the deflection of the springs to a value q/2, or even a non-linear spring characteristi or perhaps a suitable attenuation decrement dimensioning of the oscillating system.

The foregoing explanations will permit to design the springs in relation to the magnetic indexing system. The spring characteristic should not be steeper than a straight line from "C" which intersects $M_{m\ max}$ since otherwise—analog deflection adjacent "C"—the magnetic indexing system could not react anymore. The spring characteristic, on the other hand, should not be so flat that due to the unavoidable frictions the unstabel range at "C" will be too broad. It will further be understood that it is desirable to have a $M_m$-characteristic as linear as possible between $M_{m\ max}$ and C and to make $x_1 \cdot q$ which is the abscissa value for $M_{m\ max}$ as small as possible.

It is not compulsory to provide the elastic coupling exactly at the point where it had been provided in FIGS. 1–3. In making use of design details known per se in the art of scales the same effects may be obtained in the embodiment of FIGS. 29–33.

Figure 30A:
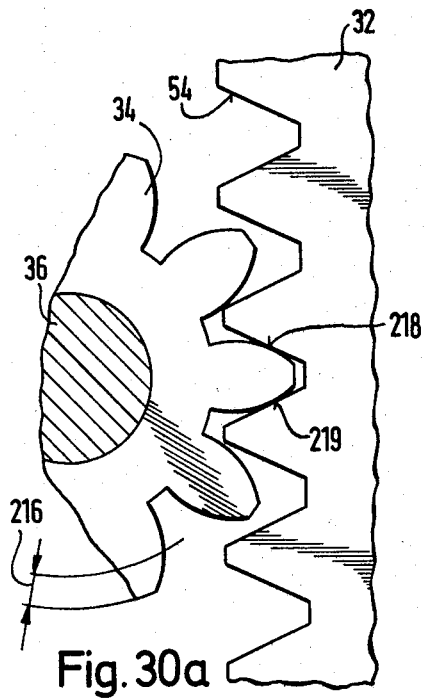
FIGS. 30a, 30b illustrates the relative positions of toothed rack and pinion in the embodiment of FIG. 29 under unloaded (FIG. 30a) and loaded (FIG. 30b) condition, respect.
Figure 30:
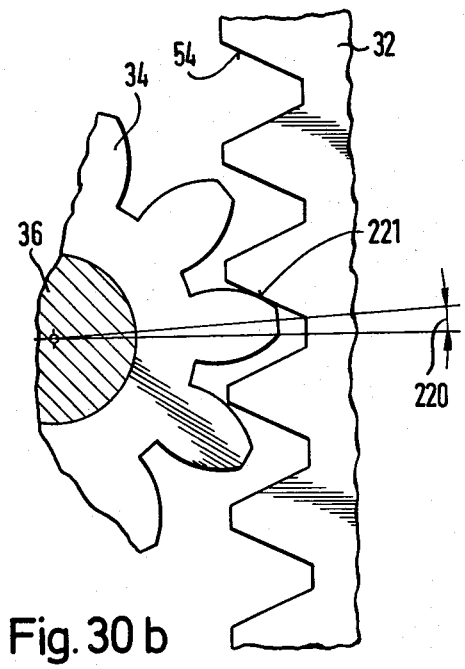

In this embodiment, the teeth 54 are directly machined in the racklike and translatorily moveable measuring member 323. Teeth 54 engage the teeth of pinion 34. In the unloaded condition, an engagement will result as shown in FIG. 30a.

Figure 31:
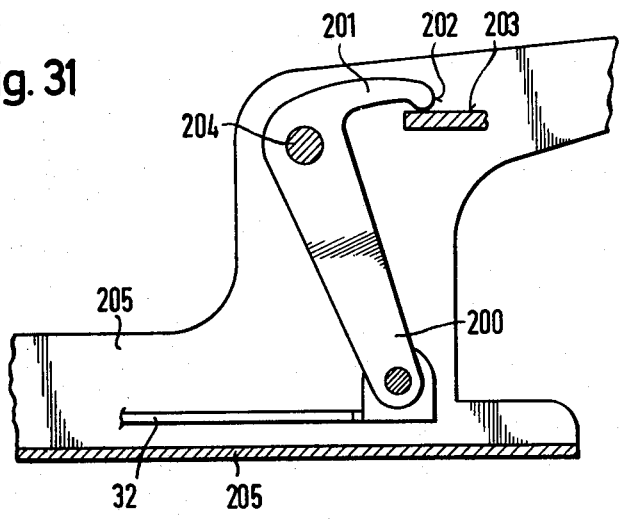
FIG. 31 illustrates schematically the engagement between scale platform and toothed rack.

Measuring member 32, however, is not rigidly coupled to the scale platform but pivotably connected, as shown in FIG. 31, to the longer arm of lever 200 which at 204 is pivotably journalled in base frame 205. The shorter lever arm 201 rests via its rounded end 202 on a support member 203 which is either part of the scale platform or its otherwise vertically deflected proportionally to a load on the platform.

At 206, a wire bar 207 is rigidly connected to measuring member 32. Hooks 208 and 209, respectively, are formed at the ends of wire 207, and tension springs 212 and 213, respectively, are stretched between hooks 208, 209 and stationary notches 210 and 211, respectively, formed on base frame 205.

The back of measuring member 32 opposite teeth 54 is not constantly held in engagement with the pinion teeth. Instead, a stop member 215 is formed to the base frame and between the stop member and the mesuring member there is a clearance 214. The stop member prevents that the toothed rack 32 and the pinion 34 will completely disengage but permits the toothed rack to assume a position relative to the pinion as shown in FIG. 30b, i.e. to become laterally displaced by less than the height of one tooth, the members still being in positive engagement at 221.

Springs 212 and 213 act symmetrically with respect to the pinion shaft 36 upon measuring member 32. The force stored by them is very small relative to the platform bias spring, however, their force will be sufficient to return the measuring member 32 into its rest position and to hold the lever end 202 permanently in contact with support 203. Further, upon lateral displacement of measuring member 32, a transversely acting force is developped tending to bring the teeth 54 back into "normal" engagement with pinion 34, i.e. a positive engagement with two contacting points 218, 219, as shown in FIG. 30a.

Upon a sudden deflection of the scale platform, at first the gear system will yield because of the inertia of the rotatabl member, and the springs 212 and 213 will develop the transverse force discussed above, Due to the friction between rack back 217 and stop member 215 the transitional oscillations will be attenuated. At the end of the transitions, in general the angular position of rotatable member 30 will not correspond to the normal teeth engagement but the magnetic torque acting upon pinion 34 will push the teeth 54 laterally, the maximum angle 220 by which the pinion is rotated due to the magnetic torque being small enough to maintain positive teeth engagement. Under all circumstances, there will be positive coupling of the teeth in spite of the yielding springs.

Figure 34:
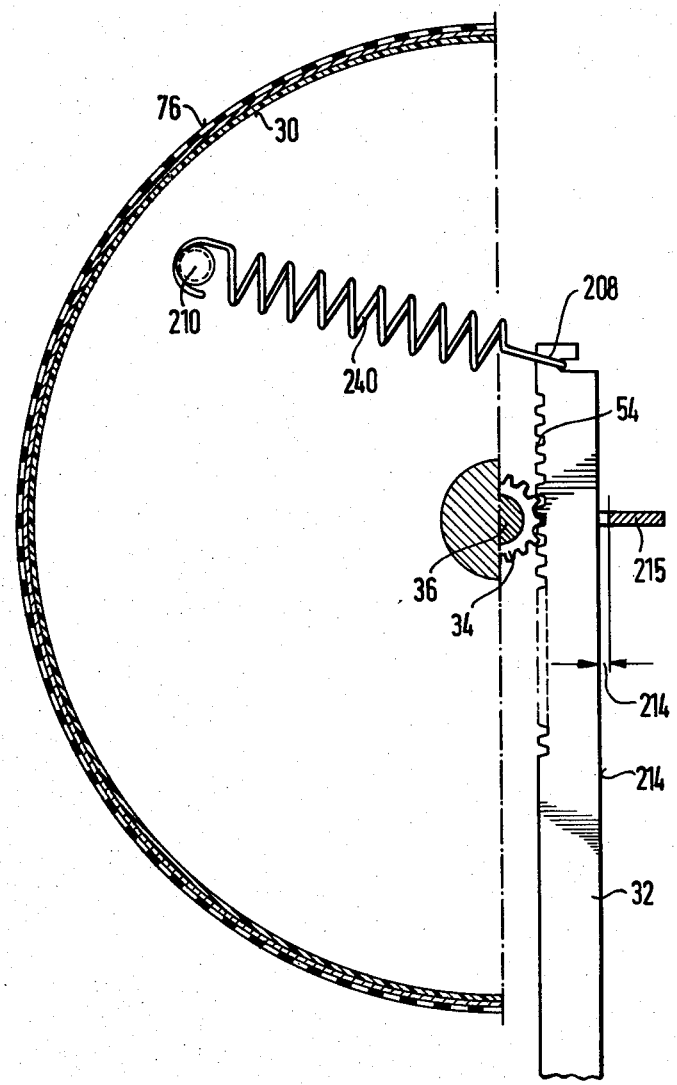
FIG. 34 illustrates schematically an alternative design of the measuring system applied in FIG. 29.

FIG. 34 illustrates that the same effect may be obtained using but one spring 240, and the operation will be obvious to an expert skilled in the art under consideration of the foregoing description.

Figure 32:
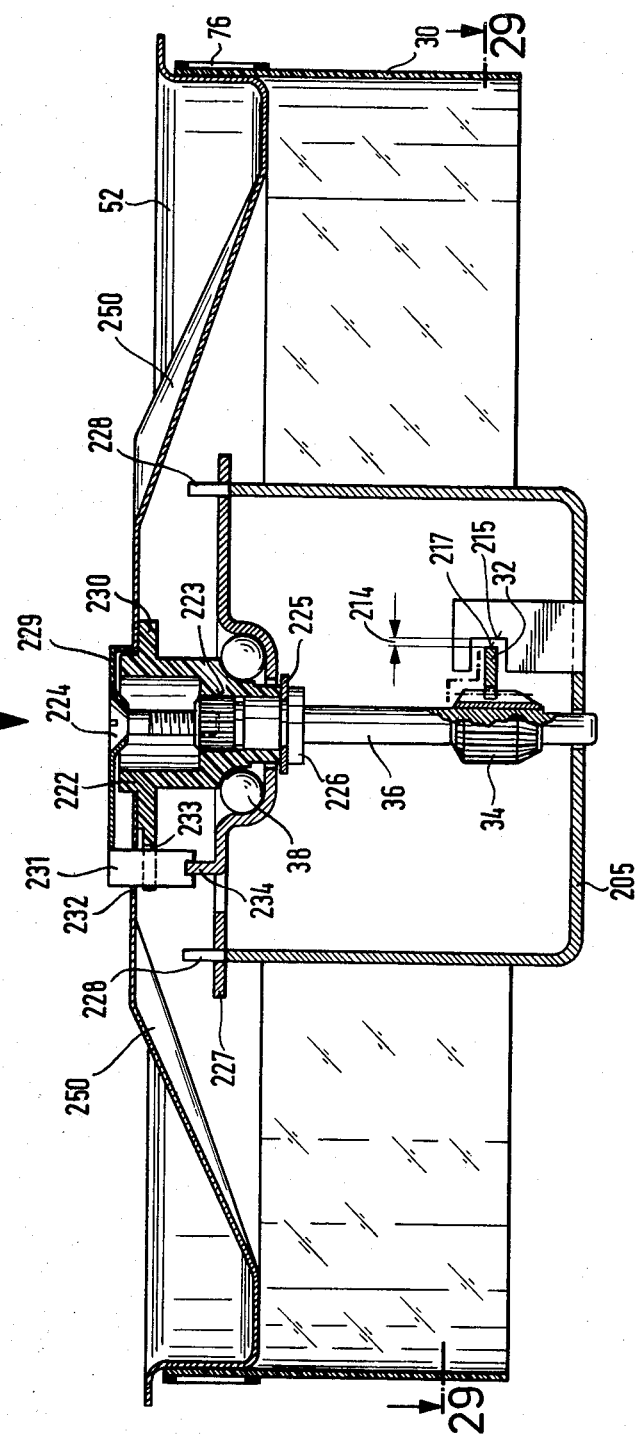
FIG. 32 is an axial section according to line 32—32 of FIG. 29 to illustrate the rotatable member which, in FIG. 29, is just schematically indicated.
Figure 33:
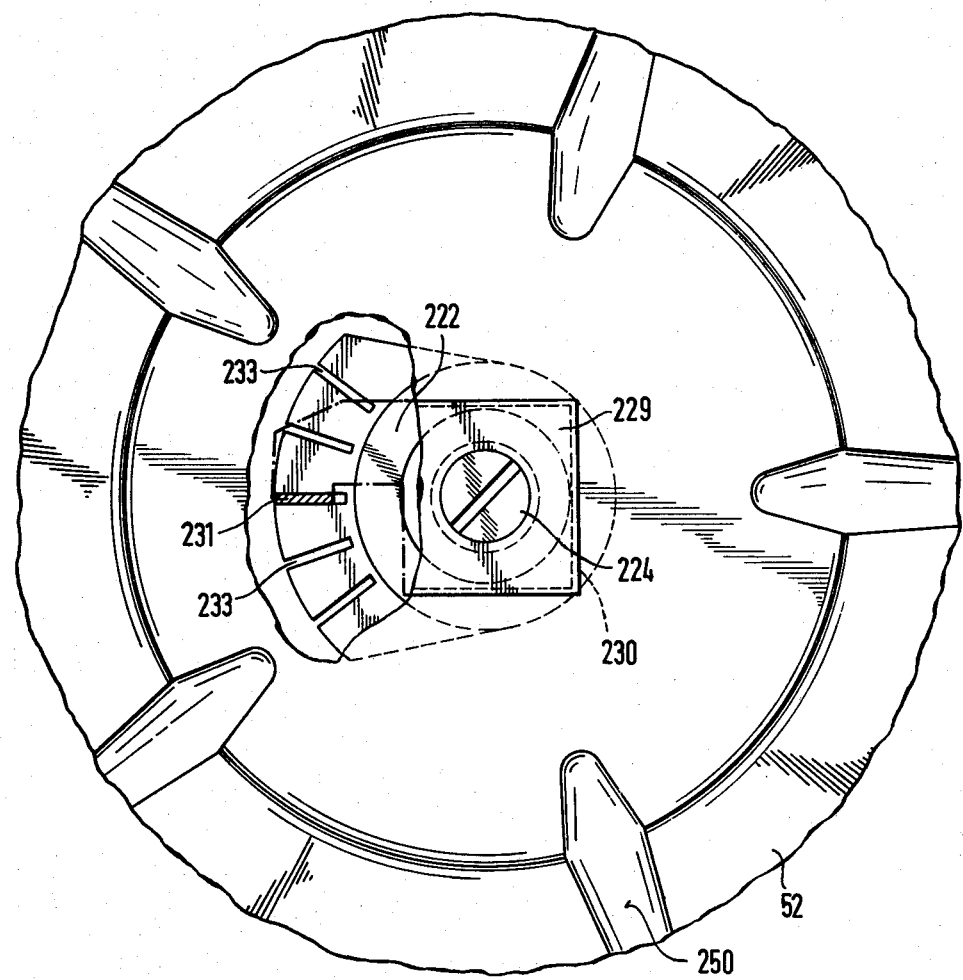
FIG. 33 is a partly broken away plan view of the rotatable member shon in FIG. 32.

In FIG. 32 the code carrier 52 is a deep drawn dish shaped member made of thin aluminum sheet material and stiffened by ribs 250. The carrier is connected to an intermediate member 222 made of plastic and press-fitted unto pinion shaft 36 which is made of brass. Knurling 223 prevents relative rotation. Further, intermediate member 222 is pulled against shoulder 226 by means of screw 224 and safety washer 225. Bearing plate 227 is mounted on base frame 205 by means of lugs 228 forming parts of the base frame. Intermediate member 222 and plate 227 are provided with ball races for bearing balls 38 supporting the rotatable member radially and axially.

Carrier 52 is pressed unto the radial flange 230 of intermediate member 222 by a resilient washer 229 disposed beneath the head of screw 224. At the left hand end of washer 229, as see in FIG. 32, elastic tongue 231 is bent downwardly extending through a slot 232 of code carrier 52 and one of several coextending slots 233 of intermediate member 222. Its free end abut a lug 234 bent upwardly from bearing plate 227 in each of the two angular end positions of code carrier 52. Thus, the rotation of the code carrier is limited to at most 360°. The elements just described replace the stop means 60 through 66 provided in the embodiment of FIGS. 1–3.

The plurality of slots 233 in the intermediate member 222 permit relative rotation of code carrier 52 and thus of the code plate 30 with respect to pinion 34 during assembly by one half of the teeth pitch of pinion 34. This permits a coarse alignment of the initial code pattern position. The fine adjustment will be effected by variation of the main spring bias as is usual practice in the art of scales.

What is claimed is:

1. Digital optical display device for indicating the position of a moveable measuring member relative to its rest position, the device comprising a code plate adapted to be moved by said measuring member substantially proportionally and provided with a code pattern consisting of opaque and transparent areas, the code plate being irradiated by a stationary light source from one side of the plate while at the other side inlets of light guides are mounted which in accordance with the code pattern illuminate a seven-segment display, an unambiguous display being possible only in certain relative positions of code plate and light guide inlets, the code plate being operatively connected to a magnetic indexing system providing a multiplicity of magnetic indexing locking positions in sequential step by step relation to each other and corresponding to said certain relative positions of the code plate and light guide inlets, while all remaining optical members are stationary, and a spring coupling between the measuring member and code plate for moving the code plate, the coupling being elastically resilient with strength less than the magnetic indexing forces within one magnetic indexing position and the spring coupling having strength in excess of the magnetic indexing forces without one magnetic indexing position and allowing the code plate to be retained precisely at a particular indexing position and within one index position of the location at which the measuring member has stopped.

2. Device as claimed in claim 1, characterized in that said coupling comprises springs which have a characteristic adapted to the locking force of said magnetic indexing system in such a manner that the coupling is non-yielding within two magnetic locking steps.

3. Device as claimed in claim 1, characterized in that said magnetic indexing system comprises a stationary permanent magnet system as a lock and a soft magnetic latch moveable with said code plate.

4. Device as claimed in claim 3, characterized in that the latch is a tape in ladder configuration wherein the rung spacing defines the distance between the locking positions.

5. Device as claimed in claim 4, characterized in that the tape is integrally formed with the code plate.

6. Device as claimed in claim 5, characterized in that the tape with the code plate is made by a cutting operation.

7. Device as claimed in claim 5, characterized in that the tape and the code are mounted on a transparent carrier.

8. Device as claimed in claim 7, characterized in that the tape and the code are printed on the carrier.

9. Device as claimed in claim 4, characterized in that the code plate is rotatable and that the tape is designed as a clamping annulus for mounting the code plate on a carrier.

10. Device as claimed in claim 3, characterized in that the latch is made of a helical wire, the helix having a pitch corresponding to the indexing steps.

11. Device as claimed in claim 10, characterized in that the code plate is rotatable and the latch is designed as a clamping annulus for mounting the code plate on a carrier.

12. Device as claimed in claim 3, characterized in that the latch is a corrogated tape with protuberances facing the lock.

13. Device as claimed in claim 3, characterized in that the latch is designed as a carrier having stamped protuberances.

14. Device as claimed in claim 3, characterized in that the latch is integral with a carrier for the code plate.

15. Device as claimed in claim 14, characterized in that the code plate is rotatable and said carrier is a disk lying normal to and concentric of the rotation axis and the carrier having teeth stamped at its circumference, said teeth being bent orthogonally with respect to the disk plane and serving as the latch, said code plate being resiliently pressed onto said teeth which serves as abutments for the code plate.

16. Device as claimed in claim 3, characterized in that several locks are provided.

17. Device as claimed in claim 16, characterized in that the code plate is rotatable and all locks are mounted such that their forces compensate each other in the bearing of the code plate.

18. Device as claimed in claim 16, characterized in that the locks are disposed bilaterally of a latch.

19. Device as claimed in claim 14, characterized in that the carrier, the code plate and the latch are integrally formed of a soft magnetically sheet metal.

20. Device as claimed in claim 3, characterized in that the latch is elastic in the direction of its movement.

21. Device as claimed in claim 5, characterized in that the code plate is rotatable and has a plurality of apertures by which it may be positioned on a rotating carrier axially and in circumferential direction.

22. Device as claimed in claim 1, wherein a linearly moveable measuring member is coupled via a toothed rack to the rotatable code plate mounted on a pinion which is provided with teeth in engagement with said rack teeth, and that the rack teeth may be displaced laterally with respect to the pinion teeth against the bias of at least one spring.

23. Device as claimed in claim 22, wherein a stop member adjacent the rack back opposite the teeth thereof, the clearance between said rack and said stop member being smaller than the height of the rack teeth.

24. Device as claimed in claim 3, characterized in that the code plate is rotatable and including a stop element to limit the code plate rotation to a maximum of 360°.

25. Device as claimed in claim 24, characterized in that said stop element is resilient.

26. Device as claimed in claim 24, characterized in that said stop element is designed as coarse adjustment means to position the code plate relative to a shaft which is in engagement with said measuring member.

27. Digital optical display device as claimed in claim 23 wherein said at least one spring has a characteristic adapted to the locking force of said magnetic indexing system in such a manner that it is non-yielding within two magnetic locking positions in the direction of linear movement of said rack.

28. Digital optical display device as claimed in claim 1 wherein the coupling comprises a pinion connected to the code plate, a rack meshed with and movable linearly along the pinion, and a spring urging and maintaining the rack in mesh with the pinion and also supporting the rack and urging the rack along the pinion.

* * * * *